United States Patent [19]

Kumaki et al.

[11] Patent Number: 5,204,558
[45] Date of Patent: Apr. 20, 1993

[54] OUTPUT BUFFER CIRCUIT AND METHOD OF OPERATION THEREOF WITH REDUCED POWER CONSUMPTION

[75] Inventors: Satoshi Kumaki; Shinichi Uramoto, both of Hyogo, Japan

[73] Assignee: Mitsubishi Denki Kabushiki Kaisha, Tokyo, Japan

[21] Appl. No.: 760,458

[22] Filed: Sep. 17, 1991

[30] Foreign Application Priority Data

Sep. 22, 1990 [JP] Japan .................. 2-252834

[51] Int. Cl.⁵ .................. H03K 19/092; H03K 17/56
[52] U.S. Cl. .................. 307/475; 307/451; 307/296.3; 307/246
[58] Field of Search .............. 307/451, 475, 542, 550, 307/558, 568, 246, 576, 573, 579, 482, 296.3

[56] References Cited

U.S. PATENT DOCUMENTS

| | | | |
|---|---|---|---|
| 4,499,387 | 2/1985 | Konishi | 307/246 |
| 4,574,203 | 3/1986 | Baba | 307/482 |
| 4,707,623 | 11/1987 | Bismarck | 307/451 |
| 4,959,565 | 9/1990 | Knecht et al. | 307/542 |
| 4,983,861 | 1/1991 | Kikuchi et al. | 307/451 |
| 5,036,227 | 7/1991 | Jo et al. | 307/451 |

FOREIGN PATENT DOCUMENTS

2539876 3/1977 Fed. Rep. of Germany .
61-121518 6/1986 Japan .

*Primary Examiner*—Edward P. Westin
*Assistant Examiner*—Richard Roseen
*Attorney, Agent, or Firm*—Lowe, Price, LeBlanc & Becker

[57] ABSTRACT

An output buffer circuit comprises a P channel MOS transistor connected between a power supply terminal and an output terminal, an N channel MOS transistor connected between a ground terminal and an output terminal, a capacitance connected to a ground terminal, and a switch formed of an N channel MOS transistor connected between the output terminal and the capacitance. In charging a load, first, charge stored in the capacitance is supplied to the output terminal, and subsequently the P channel MOS transistor is turned on. In discharging the load, first, charge is supplied from the output terminal to the capacitance, and subsequently the N channel MOS transistor is turned on.

10 Claims, 7 Drawing Sheets

OUTPUT BUFFER CIRCUIT AND METHOD OF OPERATION THEREOF WITH REDUCED POWER CONSUMPTION

BACKGROUND OF THE INVENTION

1. Field of the Invention

This invention relates to an output buffer circuit, and more particularly, to reducing power consumption of an output buffer circuit.

2. Description of the Background Art

Figure 7:
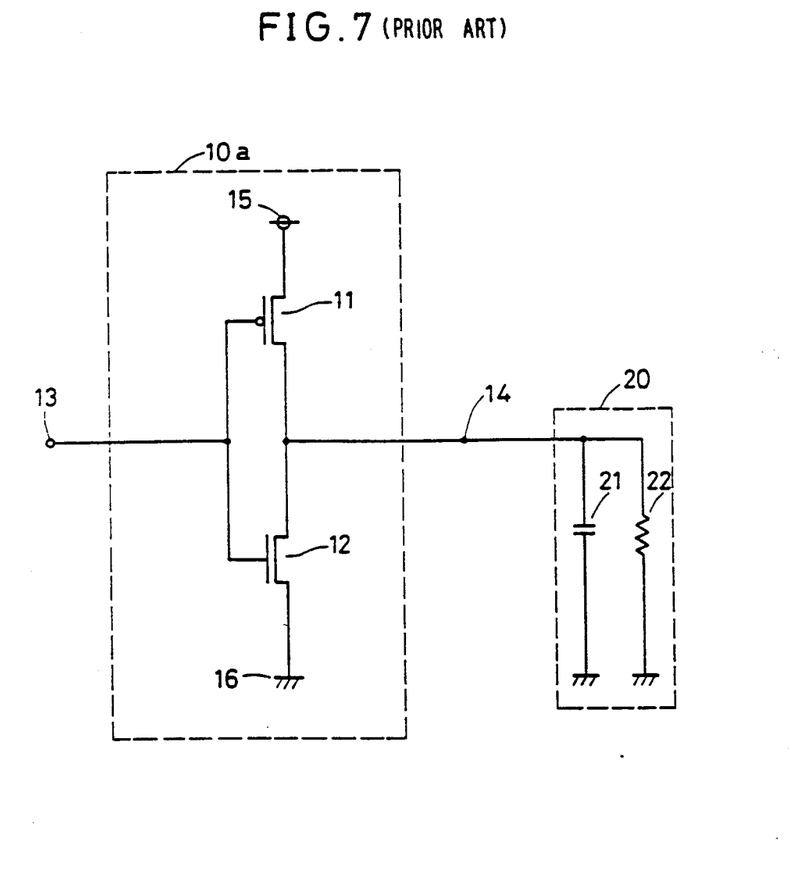
FIG. 7 is a circuit diagram showing a configuration of a conventional output buffer circuit.

Outputs of various circuits such as logic circuits and memory circuits are provided with output buffer circuits in order to increase load driving capability. FIG. 7 is a circuit diagram showing one example of a configuration of a conventional buffer circuit.

In FIG. 7, an output buffer circuit 10a has an input terminal 13 receiving signals from various circuits and an output terminal 14 for producing output signals. An external load 20 is connected to output terminal 14. Output buffer circuit 10a comprises a pull-up transistor formed of a P channel MOS transistor and a pull-down transistor formed of an N channel MOS transistor. Pull-up transistor 11 is connected between a power supply terminal 15 and output terminal 14. A pull-down transistor 12 is connected between a ground terminal and output terminal 14. The gates of pull-up transistor 11 and pull-down transistor 12 are connected to an input terminal 13. External load 20 comprises an external load capacitance 21 and an external load resistance 22.

When a signal applied to input terminal 13 is at "L" (low logic level), pull-up transistor 11 is turned on and pull-down transistor 12 is turned off. As a result, an output signal derived from output terminal 14 attains "H" (high logic level), and external load capacitance 21 is charged. When a signal applied to input terminal 13 is at "H", pull-up transistor 11 is turned off and pull-down transistor 12 is turned on. As a result, an output signal derived from output terminal 14 falls down to "L" and external load capacitance 21 is discharged.

Pull-up transistor 11 and pull-down transistor 12 are normally about ten times the size of the smallest transistor in a semiconductor integrated circuit, so that the load driving capability increases.

As mentioned above, in a conventional output buffer circuit, charging current and discharging current for an external load capacitance 21 all flow through pull-up transistor 11 or pull-down transistor 12, so that a problem exists that power consumption increases due to heat loss of transistor resistance.

SUMMARY OF THE INVENTION

An object of this invention is to reduce power consumption in an output buffer.

It is an object of this invention to obtain an output buffer circuit with its power consumption reduced and a method of operation thereof by decreasing current flowing through a transistor at the time of charging and discharging external load.

An output buffer circuit according to this invention comprises an output terminal for producing an output signal, a charging circuit for charging the output terminal in response to an input signal, a discharging circuit for discharging the output terminal in response to an input signal and a charge storage device for storing charge. The output buffer circuit further comprises a switch. The switch supplies charge from the charge storage device to the output terminal in a predetermined period during the charging operation by the charging circuit and supplies charge from the output terminal to a charge storage device in a predetermined period during the discharging operation by the discharging circuit.

In the output buffer circuit, when the output terminal is charged or discharged by the charging circuit or the discharging circuit, a part of charging or discharging of the output terminal is performed by the charge storage device and the switch, so that charging and discharging current of the charging circuit and the discharging circuit is reduced. Heat loss in the charging circuit and the discharging circuit is, therefore, reduced and power consumption of the output buffer circuit is reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
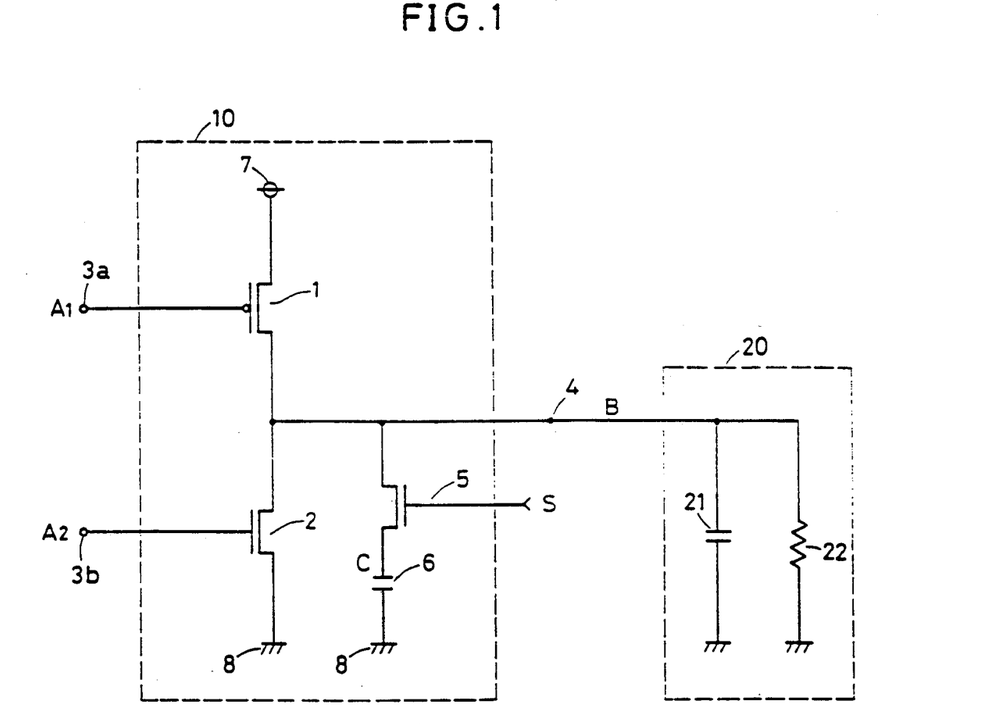
FIG. 1 is a circuit diagram showing a configuration of an output buffer circuit according to one embodiment of this invention.

An output circuit 10 according to one embodiment of this invention has input terminals 3a, 3b which receive input signals A1, A2, respectively, and an output terminal 4 for producing an output signal B. Output buffer circuit 10 comprises a pull-up transistor 1 formed of a P channel MOS transistor, a pull-down transistor 2 formed of an N channel MOS transistor, a switch 5 formed of an N channel MOS transistor and a charge storage capacitance 6. Pull-up transistor 1 is connected between a power supply terminal 7 and output terminal 4. Pull-down transistor 2 is connected between a ground terminal 8 and output terminal 4. The gate of pull-up transistor 1 is connected to an input terminal 3a, and the gate of pull-down transistor 2 is connected to an input terminal 3b. A switch 5 and a load storage capacitance 6 are connected in series between output terminal 4 and ground terminal 8. A control signal S is applied to the gate of switch 5 from a control circuit to be described below.

An external load 20 is connected to output terminal 4. External load 20 comprises an external load capacitance 21 and an external load resistor 22.

Figure 2:
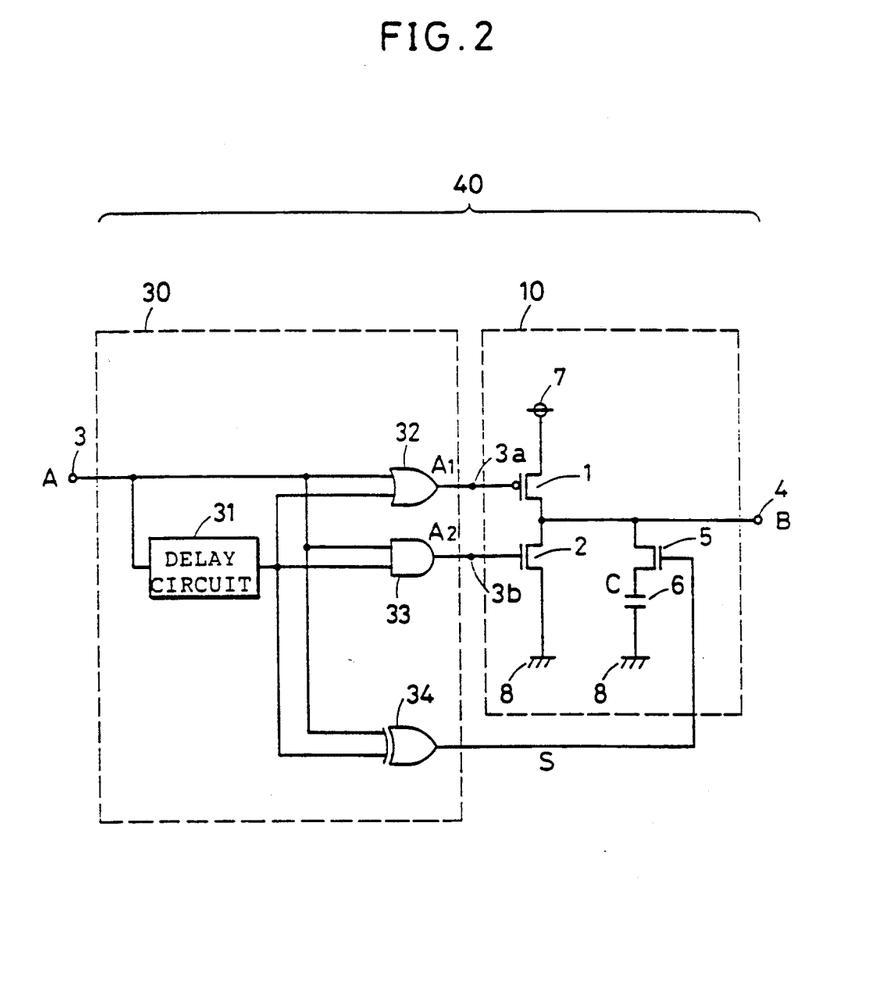
FIG. 2 is a circuit diagram showing a configuration of a control signal for controlling the output buffer circuit of FIG. 1.

FIG. 2 is a circuit diagram showing a configuration of a control circuit.

Referring to FIG. 2, a control circuit 30 receives an output signal from a prescribed circuit as an input signal A, and generates input signals A1, A2 and a control signal S. Control circuit 30 comprises a delay circuit 31, an OR gate 32, an AND gate 33, and an exclusive OR gate 34. An input terminal 3 receiving input signal A is connected to an input terminal of delay circuit 31, one input terminal of OR gate 32, one input terminal of AND gate 33 and one input terminal of exclusive OR gate 34. An output terminal of delay circuit 31 is connected to the other input terminal of OR gate 32, the other input terminal of AND gate 33 and the other input terminal of exclusive OR gate 34. Input signal A1 is derived from an output terminal of OR gate 32, and input signal A2 is derived from an output terminal of AND gate 33. Control signal S is derived from an output terminal of exclusive OR gate 34. An output buffer circuit 10 and control circuit 30 constitute an output circuit 40.

Figure 3:
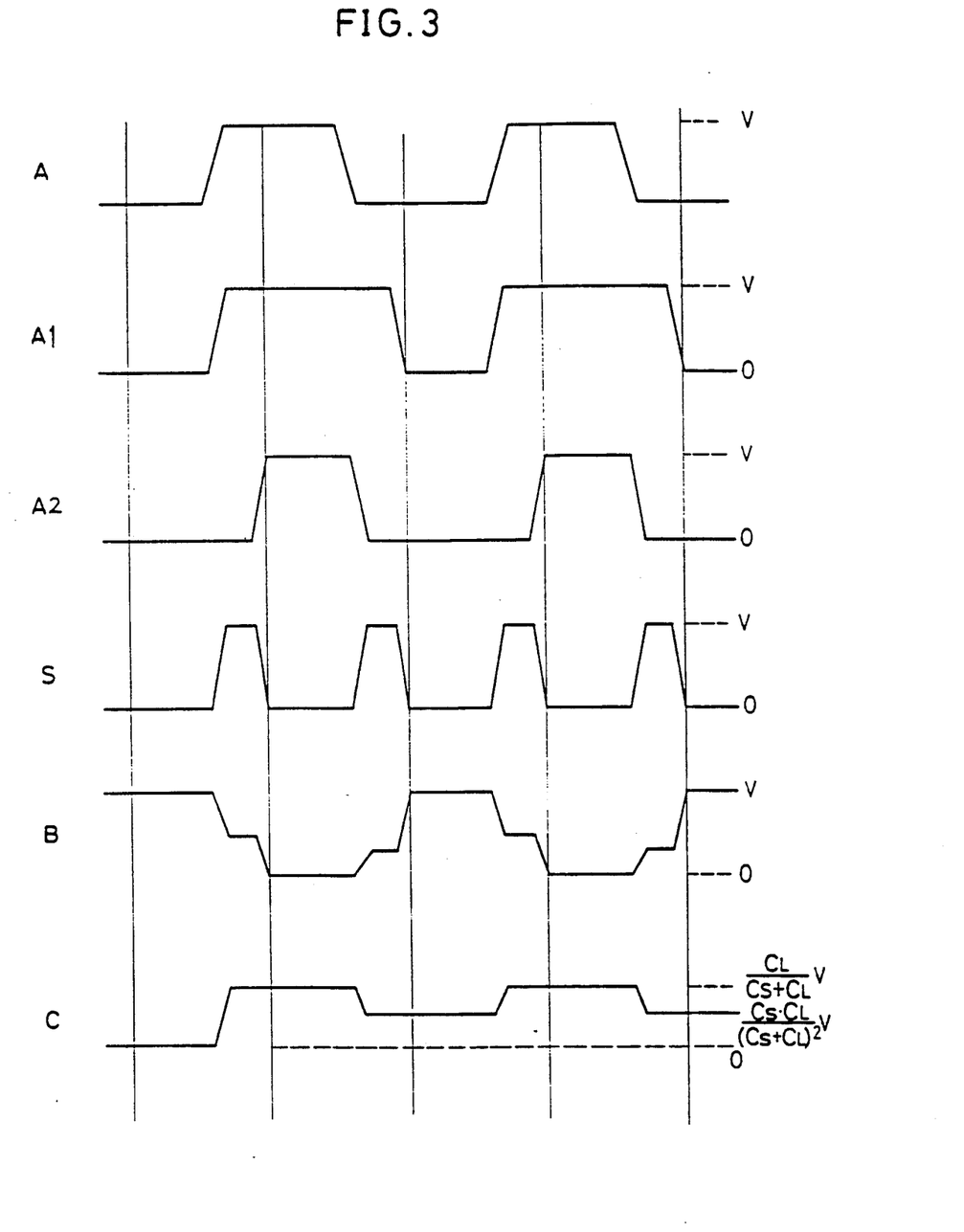
FIG. 3 is a waveform diagram for describing operation of the output buffer circuit of FIG. 1.

Referring to a waveform diagram of FIG. 3, operation of output buffer circuit 10 shown in FIGS. 1 and 2 will be described.

"C" shows a potential difference between both ends of a charge storage capacitance 6.

When input signal A and input signals A1, A2 are at "L", pull-up transistor 1 is held on, and pull-down transistor 2 and switch 5 is held off. External load capacitance 21 within external load 20 is in a state of charging.

When the level of input signal A changes from "L" to "H", the level of input signal A1 changes from "L" to "H". As a result, pull-up transistor 1 is turned off. Simultaneously control signal S attains "H". Consequently, switch 5 is turned on, and charge stored in external load capacitance 21 is supplied to charge storage capacitance 6. When charge is stored in charge storage capacitance 6 to some extent, input signal A2 rises from "L" to "H". As a result, pull-down transistor 2 is turned on. Simultaneously, control signal S falls to "L", so that switch 5 is turned off. As a result, charge remaining in external load capacitance 21 is discharged to ground terminal through pull-down transistor 2 and therefore output signal B falls to "L".

Thus, when output signal B is at "L", pull-up transistor 1 is held on, and pull-down transistor 2 is held on, and charge storage capacitance 6 is charged, and charge is not stored in external load capacitance 21.

When input signal A falls from "H" to "L", input signal A2 falls from "H" to "L", so that pull-down transistor 2 is turned off. Simultaneously control signal S rises to "H". As a result, switch 5 is turned on and charge storage in charge storage capacitance 6 is supplied to external load capacitance 21. When charge is stored in external load capacitance 21 to some extent, input signal A1 falls from "H" to "L", so that pull-up transistor 1 is turned on. Simultaneously control signal S falls to "L". Consequently, switch 5 is turned off. As a result, external load capacitance 21 is completely charged through pull-up transistor 1 and therefore output signal B attains "H".

Thus, when output signal B is at "H", pull-up transistor is held on, and pull-down transistor 2 is held off, and charge storage capacitance 6 is being discharged, and charge is being stored in external load capacitance 21.

Charging and discharging process of charge storage capacitance 6 will be described in detail.

Assume that a capacitance value of charge storage capacitance 6 is $C_S$ and that a capacitance value of external load capacitance 21 is $C_L$. And also assume that the potential of output terminal 4 when output signal B is at "H" is V, and that the potential of output terminal 4 when output signal B is at "L" is 0.

When charge storage capacitance 6 is charged, external load capacitance 21 is charged with potential V of output terminal 4. When switch 5 is turned on under this condition, a part of charge $C_L V$ stored in external load capacitance 21 is distributed to charge storage capacitance 6, and charge storage capacitance 6 is charged. At this time, the potential appearing at output terminal 4 is $C_L \cdot V/(C_S+C_L)$, and therefore $C_S \cdot C_L \cdot V/(C_S+C_L)$ charge is stored in charge storage capacitance 6.

When charge storage capacitance 6 is discharged, charge is not stored in external load capacitance 21 because the potential of output terminal 4 is 0. When switch 5 is turned on under this condition, a part of $C_S \cdot C_L \cdot V/(C_S+C_L)$ charge stored in charge storage capacitance 6 is distributed to external load capacitance 21. At this time the potential appearing at output terminal 4 is $C_S \cdot C_L \cdot V/(C_S+C_L)^2 \cdot C_S \cdot C_L^2 \cdot V/(C_S+C_L)^2$ charge is, therefore, stored in external load capacitance 21 and $C_S^2 \cdot C_L \cdot V/(C_S+C_L)^2$ charge remains in charge storage capacitance 6.

As described above, in recharging external load capacitance 21, $C_S \cdot C_L^2 \cdot V/(C_S+C_L)^2$ charge out of the charge supplied from external load capacitance 21 at the time of discharging can be used. Assuming that the maximum stored charge of external load capacitance 21 is $C_L V$, the charge having the ratio presented by the following expression can be used.

$$\frac{C_S \cdot C_L^2}{(C_S + C_L)^2} V/C_L V \times 100 = \frac{C_S \cdot C_L}{(C_S + C_L)^2} (\%)$$

Wherein $C_L = C_S$, that is, when a capacitance value of external load capacitance 2 is equal to a capacitance value of charge storage capacitance 6, a ratio of charge used for recharging becomes maximum. Theoretically 25% of charge stored in external load capacitance 21 can be used for recharging.

Thus, a current flowing through pull-up transistor 1 and pull-down transistor 2 can be reduced, because by using charge storage capacitance 6, charge stored in external load capacitance 21 can be used for recharging external load capacitance 21.

Figure 4:
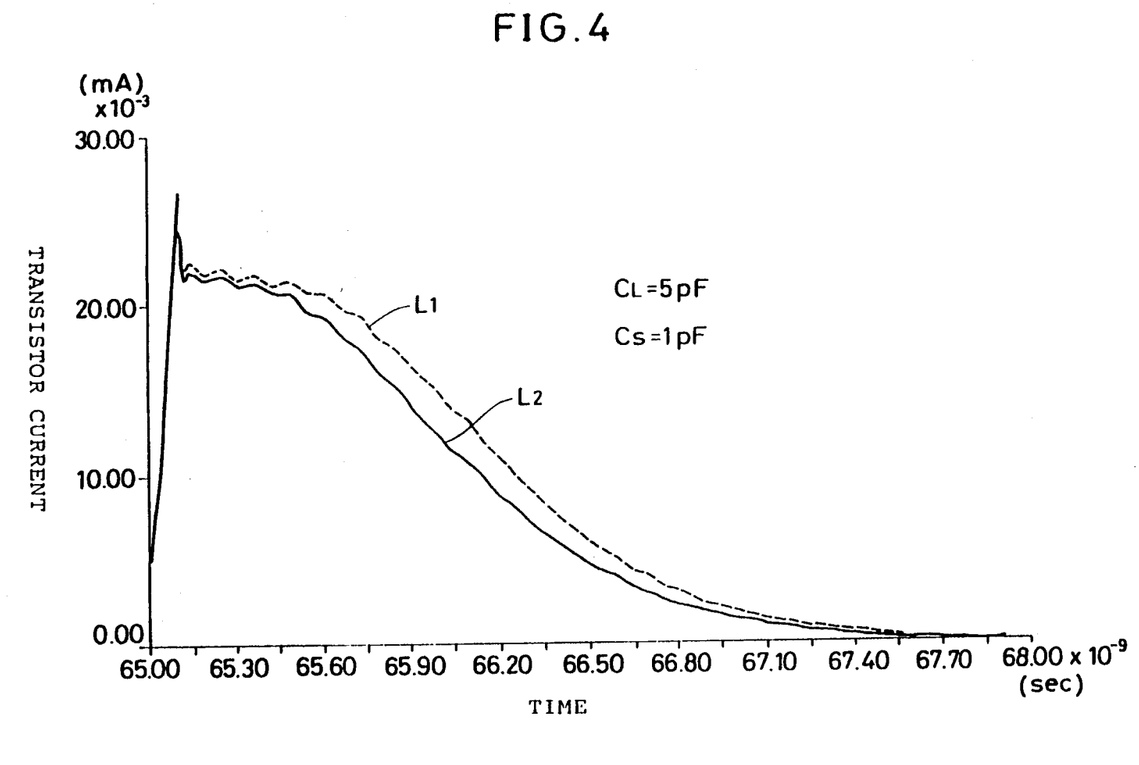
FIGS. 4 and 5 are diagrams showing simulation results of transistor current in a conventional output buffer circuit and the output buffer circuit of the embodiment of FIG. 1.
Figure 5:
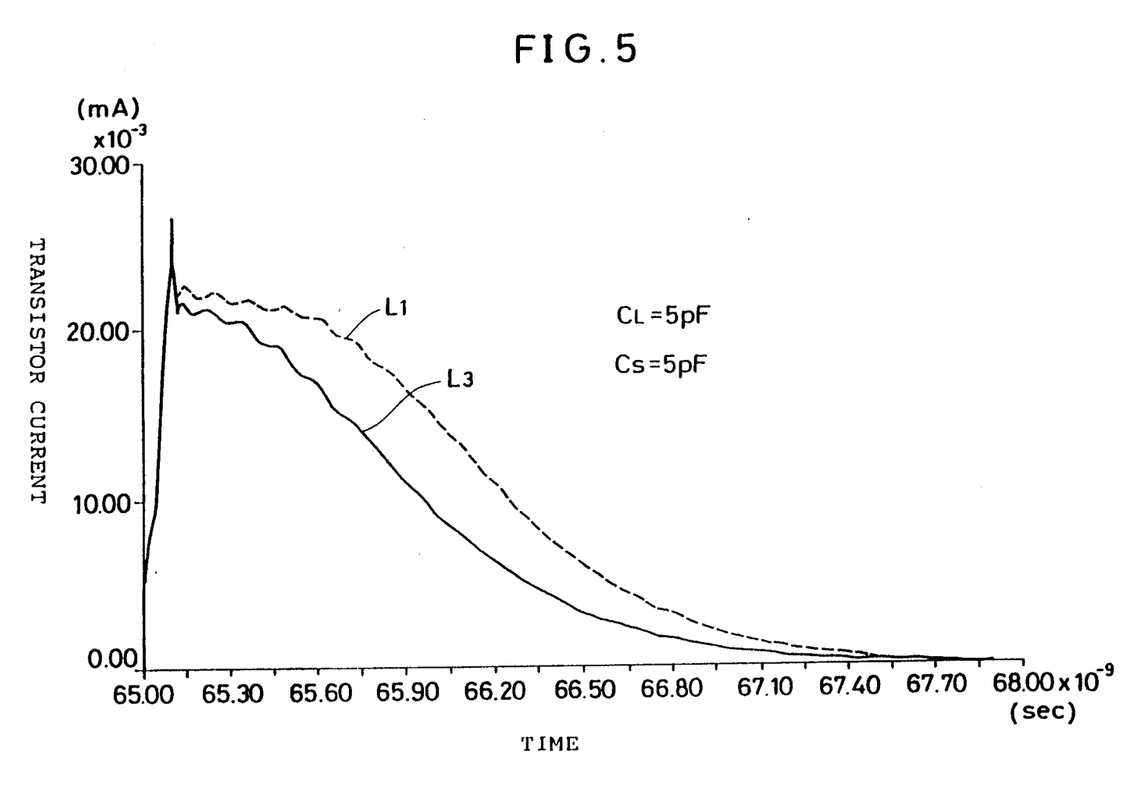

FIGS. 4 and 5 are diagrams showing simulation results of transistor current in the output buffer circuit of this embodiment and a conventional output buffer.

Referring to FIGS. 4 and 5, transistor current flowing through pull-up transistor 1 and pull-down transistor 2 connected in series is plotted on the ordinates and time is plotted on the abscissas. FIG. 4 shows simulation results in a case where a capacitance value $C_L$ of external load capacitance 21 is 5 pF and a capacitance value $C_S$ of charge storage capacitance 6 is 1 pF. FIG. 5 shows simulation results in a case where a capacitance value $C_L$ of external load capacitance 21 is 5 pF and a capacitance value $C_S$ of charge storage capacitance 6 is 5 pF.

In FIG. 4, L1 shown in a broken line is a simulation result of a conventional output buffer circuit, and L2 shown in a solid line is a simulation result of the output buffer circuit of this embodiment. In FIG. 5, L1 shown in a broken line is a simulation result of a conventional output buffer circuit, and L3 shown in a solid line is a simulation result of the output buffer circuit of this embodiment.

When simulation results L2 and L3 of the output buffer circuit of this embodiment are compared with simulation result L1 of a conventional output buffer circuit, it is understood that transistor current in the output buffer circuit of this embodiment is less than that in a conventional output buffer circuit.

In charging and discharging external load 20, charge stored in external load 20 by means of charge storage capacitance 6 can be effectively utilized in output buffer 10 of the above embodiment, whereby current flowing through pull-up transistor 1 and pull-down transistor 2 can be reduced and power consumption of output buffer 10 can be reduced.

The effect of the reduction of power consumption can be maximized by equalizing a capacitance value of external load capacitance 21 with a capacitance value of charge storage capacitance 6.

Additionally, because control signal S for controlling charging and discharging of charge storage capacitance 6 can be generated from input signal A, there is no need to provide a control terminal for applying an external control signal.

Figure 6:
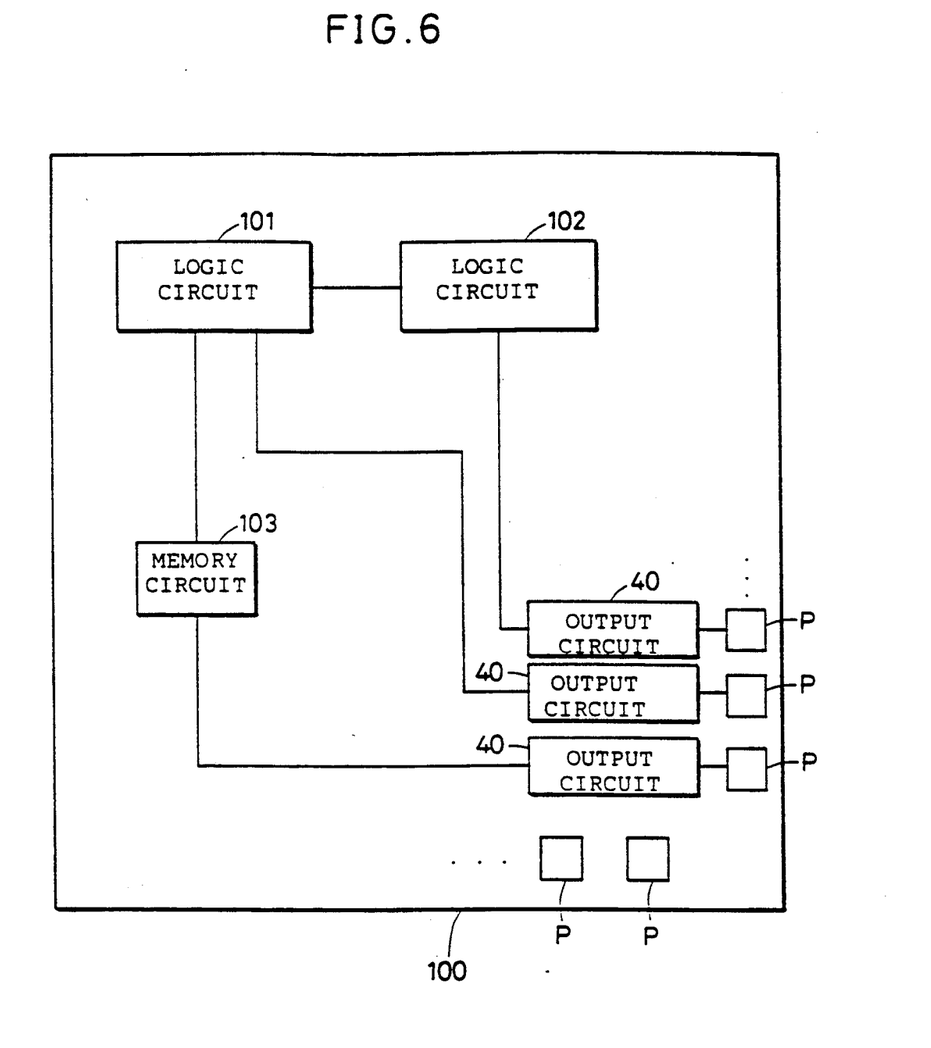
FIG. 6 is a diagram showing one example of a semiconductor integrated circuit using the output buffer circuit of the embodiment of FIG. 1.

FIG. 6 is a diagram showing one example of a semiconductor integrated circuit employing the output buffer circuit of the above embodiment.

A semiconductor integrated circuit 100 comprises logic circuits 101, 102 and a memory circuit 103. Output circuits 40 are respectively connected to output terminals of logic circuits 101, 102 and memory circuit 103. Each output circuit 40 comprises output buffer circuit 10 and control circuit 30 as shown in FIG. 2. Output terminals of these output circuits 40 are connected respectively to pads P.

In semiconductor integrated circuit 100 of FIG. 6, power consumption is reduced because the output buffer circuit of this embodiment is used.

The output buffer circuit of this embodiment can be employed not only for the semiconductor integrated circuit of FIG. 6, but also for various circuits outputting binary signals.

While switch 5 of output buffer circuit 10 is controlled by control signal S generated from control circuit 30 in the above embodiment, switch 5 may be controlled by an externally applied control signal.

A configuration of control circuit 30 is not limited to the one shown in FIG. 2, but other circuit configurations may be employed.

As described above, in accordance with this invention, in charging or discharging an output terminal, charge of external load connected to the output terminal can be effectively utilized by means of a charge storage device, so that charging and discharging currents in a charging circuit and a discharging circuit can be reduced. Power consumption of the output buffer circuit can be, therefore, reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An output buffer circuit, comprising:
    an output terminal for producing an output signal;
    charging means responsive to an input signal for charging said output terminal;
    discharging means responsive to the input signal for discharging said output terminal;
    charge storing means for storing charge;
    switching means for supplying charge from said charge storing means to said output terminal during charging by said charging means and for supplying charge from said output terminal to said charge storing means during discharging by said discharging means; and
    control means for switching said switching means in response to the input signal.

2. The output buffer circuit according to claim 1, wherein
    said charging means comprises a first field effect device of a first conductive channel type connected between a first power supply node and said output terminal,
    said discharging means comprises a second field effect device of a second conductive channel type connected between a second power supply node and said output terminal,
    said charge storing means comprises capacitance means connected to said second power supply node,
    said switching means comprises a third field effect device of a second conductive channel type connected between said capacitance means and said output terminal.

3. The output buffer circuit according to claim 2, wherein
    said first power supply node receives a prescribed power supply potential,
    said second power supply node receives a ground potential,
    said first conductive channel type field effect device comprises a P channel type MOS transistor,
    said second conductive channel type field effect device is an N channel type MOS transistor.

4. An output buffer circuit comprising:
    an output terminal for producing an output signal;
    charging means responsive to an input signal for charging said output terminal;
    discharging means responsive to the input signal for discharging said output terminal;
    charge storing means for storing charge;
    switching means for supplying charge from said charge storing means to said output terminal during charging by said charging means and fro supplying charge from said output terminal to said charge storing means during discharging by said discharging means;
    control means for switching said switching means in response to the input signal,
    said charging means comprising a first field effect device of a first conductive channel type connected between a first power supply node and said output terminal,
    said discharging means comprising a second field effect device of a second conductive channel type connected between a second power supply node and said output terminal,
    said charge storing means comprising capacitance means connected to said second power supply node,
    said switching means comprising a third field effect device of a second conductive channel type connected between said capacitance means and said output terminal,
    said control means comprising means for turning on said first and second field effect devices sequentially prior to charging, and turning on said first field effect device and turning off said second and third field effect devices, and for turning off said first and second field effect devices and turning on said third field effect device prior to discharge, and subsequently turning on said second field effect device and turning off said first ad third field effect devices.

5. The output buffer circuit according to claim 3, wherein said input signal transitions between a first logic level corresponding to said prescribed power supply potential and a second logic level corresponding to said ground potential, said output buffer circuit further comprises;

control signal generation means for generating a first signal which transitions from a second logic level to a first logic level at the time of transition of said input signal from a second logic level to a first logic level and transitions form a first logic level to a second logic level after a predetermined time following the transition of said input signal from a first logic level to a second logic level, a second signal which transitions from a second logic level to a first logic level after a predetermined time following the transition of said input signal from a second logic level to a first logic level and transitions form a first logic level to a second logic level at the time of transition of said input signal transitions form a first logic level to a second logic level, and a control signal which transitions from a second logic level to a first logic level at the timer of transition of said input signal form a second logic level to a first logic level and transitions from a first logic level to a second logic level after a predetermined time.

6. The output buffer circuit according to claim 5, wherein said control signal generation means comprises:

delay means for receiving said input signal and delaying it for a predetermined time;

OR gate means for receiving said input signal and an output signal of said delaying means and for outputting said first signal by performing an OR operation;

AND gate means for receiving said input signal and an output signal of said delaying means and for outputting said second signal by performing an AND operation; and exclusive OR means for receiving said input signal and an output signal of said delaying means and for outputting said control signal by performing an exclusive OR operation.

7. A method of operation of an output buffer circuit for driving a load in response to an input signal comprising the steps of:

discharging a load in response to setting a first logic level of said input signal; and charging a load in response to setting a second logic level of said input signal;

said discharging step comprising the steps of supplying charge from said load to charge storing means in response to setting the first logic level of said input signal, and supplying charge from said load to the ground terminal in response to a signal delayed by a first predetermined period with respect to setting the first logic level of said input signal, said charging step comprising the steps of supplying charge from said storing means to said load in response to setting the second logic level of said input signal and supplying charge form a power supply terminal to charge storage means in response to a signal delayed by second predetermined period with respect to setting the second logic level of said input signal.

8. The output buffer circuit according to claim 2, wherein said control means comprises:

means for turning off said first field effect device and turning on said third field effect device in response to setting a first level of said input signal, first delay means for forming a first signal delayed by a first predetermined time period with respect to setting the first level of said input signal, means for turning on said second field effect device and turning off said third field effect device in response to the first signal, means for turning off said second field effect device and turning on said third field effect device in response to setting a second level of said input signal, second delay means for forming a second signal delayed by a second predetermined time period with respect to setting the second level of said input signal, and means for turning on said first field effect device and turning off said third field effect device in response to the second signal.

9. An output buffer circuit, comprising:

a first field effect transistor responsive to an input signal and connected between a power supply node and an output node, a second field effect transistor responsive to the input signal and connected between a ground potential node and said output node, a third field effect transistor having a first electrode connected to said output node, a second electrode, and a control electrode for receiving a control signal, a capacitance element connected between the second electrode of said third field effect transistor and said ground potential node, and a control signal generating means responsive to said input signal for generating said control signal delayed with respect to said input signal.

10. The output buffer means according to claim 9, wherein said control signal generating means comprises:

means for turning off said first field effect device and turning on said third field effect device in response to setting a first level of said input signal, first delay means for forming a first signal delayed by a first predetermined time period with respect to setting the first level of said input signal, means for turning on said second field effect device and turning off said third field effect device in response to the first signal, means for turning off said second field effect device and turning on said third field effect device in response to setting a second level of said input signal, said delay means for forming a second signal delayed by a second predetermine time period with respect to setting the second level of said input signal, and means for turning on said first field effect device and turning off said third field effect device in response to the second signal.

* * * * *